US011078927B2

(12) United States Patent
Watanabe et al.

(10) Patent No.: US 11,078,927 B2
(45) Date of Patent: Aug. 3, 2021

(54) ELECTRONIC DEVICE HAVING A FAN

(71) Applicant: LENOVO (SINGAPORE) PTE. LTD., Singapore (SG)

(72) Inventors: Ryota Watanabe, Kanagawa (JP); Takuroh Kamimura, Kanagawa (JP); Atsunobu Nakamura, Kanagawa (JP); Akinori Uchino, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/554,771

(22) Filed: Aug. 29, 2019

(65) Prior Publication Data

US 2020/0072247 A1    Mar. 5, 2020

(30) Foreign Application Priority Data

Aug. 29, 2018 (JP) .............................. JP2018-160145
Apr. 15, 2019 (JP) .............................. JP2019-077145

(51) Int. Cl.

| | |
|---|---|
| *F04D 29/66* | (2006.01) |
| *G06F 1/16* | (2006.01) |
| *G06F 1/20* | (2006.01) |
| *H05K 7/20* | (2006.01) |

(52) U.S. Cl.
CPC ......... *F04D 29/665* (2013.01); *G06F 1/1616* (2013.01); *G06F 1/203* (2013.01); *H05K 7/20145* (2013.01); *H05K 7/20154* (2013.01); *H05K 7/20172* (2013.01); *G06F 2200/201* (2013.01)

(58) Field of Classification Search
CPC ...... F04D 29/665; G06F 1/1616; G06F 1/203; G06F 2200/201; H05K 7/20145; H05K 7/20154; H05K 7/20172
USPC .......................................................... 361/695
See application file for complete search history.

(56) References Cited

U.S. PATENT DOCUMENTS

| | | | | |
|---|---|---|---|---|
| 2,225,398 | A * | 12/1940 | Hamblin | F04D 29/665 415/119 |
| 2,252,256 | A * | 8/1941 | Harris | B64C 11/00 181/247 |
| 5,388,956 | A * | 2/1995 | Pla | F04D 25/166 415/1 |
| 6,309,176 | B1 * | 10/2001 | Periyathamby | F01P 11/12 415/119 |

(Continued)

FOREIGN PATENT DOCUMENTS

| | | | | |
|---|---|---|---|---|
| CN | | 1071424 C * | 9/2001 | ........... F04D 29/665 |
| CN | | 103835999 A | 6/2014 | |

(Continued)

*Primary Examiner* — Anatoly Vortman
(74) *Attorney, Agent, or Firm* — Antony P. Ng; Russell Ng PLLC (57) ABSTRACT

A fan having reduced discrete tone noise is disclosed. The fan includes a fan chassis having an air inlet and an air outlet formed open at an outer surface of the fan chassis; an impeller part provided in the fan chassis; a wall part forming an air passage, the air passage is provided in the fan chassis to allow air to be introduced through the air inlet by rotation of the impeller part to flow to the air outlet; and a resonator having a cavity part communicating with said air passage through a communication passage passing through the wall part.

6 Claims, 7 Drawing Sheets

(56) References Cited

U.S. PATENT DOCUMENTS

| | | | | |
|---|---|---|---|---|
| 6,390,770 B1* | 5/2002 | Takeshita | F04D 29/665 | 415/119 |
| 6,499,956 B2* | 12/2002 | Nakamura | F04D 29/545 | 181/224 |
| 6,679,686 B2* | 1/2004 | Wang | F04D 23/008 | 415/203 |
| 6,896,095 B2* | 5/2005 | Shah | F01P 5/06 | 181/198 |
| 7,033,137 B2* | 4/2006 | Shufeldt | F04D 23/008 | 415/119 |
| 7,779,960 B2* | 8/2010 | Tang | G11B 33/142 | 181/225 |
| 7,852,628 B2* | 12/2010 | Hirohata | G06F 1/20 | 361/695 |
| 7,891,464 B2* | 2/2011 | Tang | F04D 25/08 | 181/225 |
| 8,194,400 B2* | 6/2012 | Horii | G06F 1/203 | 361/679.08 |
| 9,970,443 B2* | 5/2018 | Chang | F04D 29/522 | |
| 10,323,655 B2* | 6/2019 | Arima | F04D 1/00 | |
| 10,473,120 B2* | 11/2019 | Thawani | F04D 29/4226 | |
| 2001/0018022 A1* | 8/2001 | Nakamura | F04D 29/545 | 415/203 |
| 2003/0183446 A1* | 10/2003 | Shah | F04D 29/665 | 181/205 |
| 2004/0071546 A1* | 4/2004 | Werner | E01H 1/0809 | 415/119 |
| 2005/0161280 A1* | 7/2005 | Furuya | F01N 1/003 | 181/225 |
| 2005/0205351 A1* | 9/2005 | D'Angelo | F01N 1/00 | 181/216 |
| 2005/0276684 A1* | 12/2005 | Huang | F04D 29/422 | 415/119 |
| 2007/0292261 A1* | 12/2007 | Tang | F04D 25/08 | 415/119 |
| 2009/0308685 A1* | 12/2009 | Gorny | F04D 29/665 | 181/205 |
| 2018/0135654 A1* | 5/2018 | Ting | G06F 1/20 | |
| 2019/0338784 A1* | 11/2019 | Chen | F04D 29/441 | |

FOREIGN PATENT DOCUMENTS

| | | | | |
|---|---|---|---|---|
| CN | 204705975 U | 10/2015 | | |
| CN | 105526193 A | 4/2016 | | |
| CN | 205841325 U | 12/2016 | | |
| CN | 107517567 A | 12/2017 | | |
| CN | 108071601 A | 5/2018 | | |
| CN | 108087340 A | 5/2018 | | |
| CN | 108240357 A | 7/2018 | | |
| JP | 0374600 A | 3/1991 | | |
| JP | 07332284 A | 12/1995 | | |
| JP | 2009191721 A | 8/2009 | | |
| JP | 2009191721 A | * | 8/2009 | F04D 29/66 |
| JP | 2011149380 A | 8/2011 | | |
| JP | 2017-118018 A | 6/2017 | | |
| JP | 2017118018 A | 6/2017 | | |
| KR | 10-1723088 | 4/2017 | | |

* cited by examiner

ELECTRONIC DEVICE HAVING A FAN

PRIORITY CLAIM

The present application claims benefit of priority under 35 U.S.C. §§ 120, 365 to the previously filed Japanese Patent Application No. JP2018-160145 with a priority date of Aug. 29, 2018, and the previously filed Japanese Patent Application No. JP2019-077145 with a priority date of Apr. 15, 2019, which are incorporated by reference herein.

TECHNICAL FIELD

The present invention relates to electronic devices in general, and in particular to an electronic device having a fan.

BACKGROUND

Many electronic devices, such as a laptop personal computer (laptop PC), include a chassis in which a fan configured to dissipate heat generated by electronic components, such as a central processing unit (CPU), to the outside is installed. With the fan described above, there are situations where discrete tone noise with outstanding noise levels at specific frequency components is generated. Since the tonality of this noise is high, it is a very harsh sound.

A prior art method for reducing the fan noise is by variably controlling the rotational speed of the fan. However, this method requires special control for reducing the noise of the fan. Furthermore, it is desirable that the rotational speed of the fan be set according to the heat generation state.

Consequently, it would be desirable to provide a fan having reduced discrete tone noise.

SUMMARY

In accordance with an embodiment of the present disclosure, a fan includes a fan chassis having an air inlet and an air outlet formed open at an outer surface of the fan chassis; an impeller part provided in the fan chassis; a wall part forming an air passage, the air passage is provided in the fan chassis to allow air to be introduced through the air inlet by rotation of the impeller part to flow to the air outlet; and a resonator having a cavity part communicating with the air passage through a communication passage passing through the wall part.

With the above-described configuration, discrete tone noise of the fan can be reduced by the resonator connected to the air passage formed in the fan chassis.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
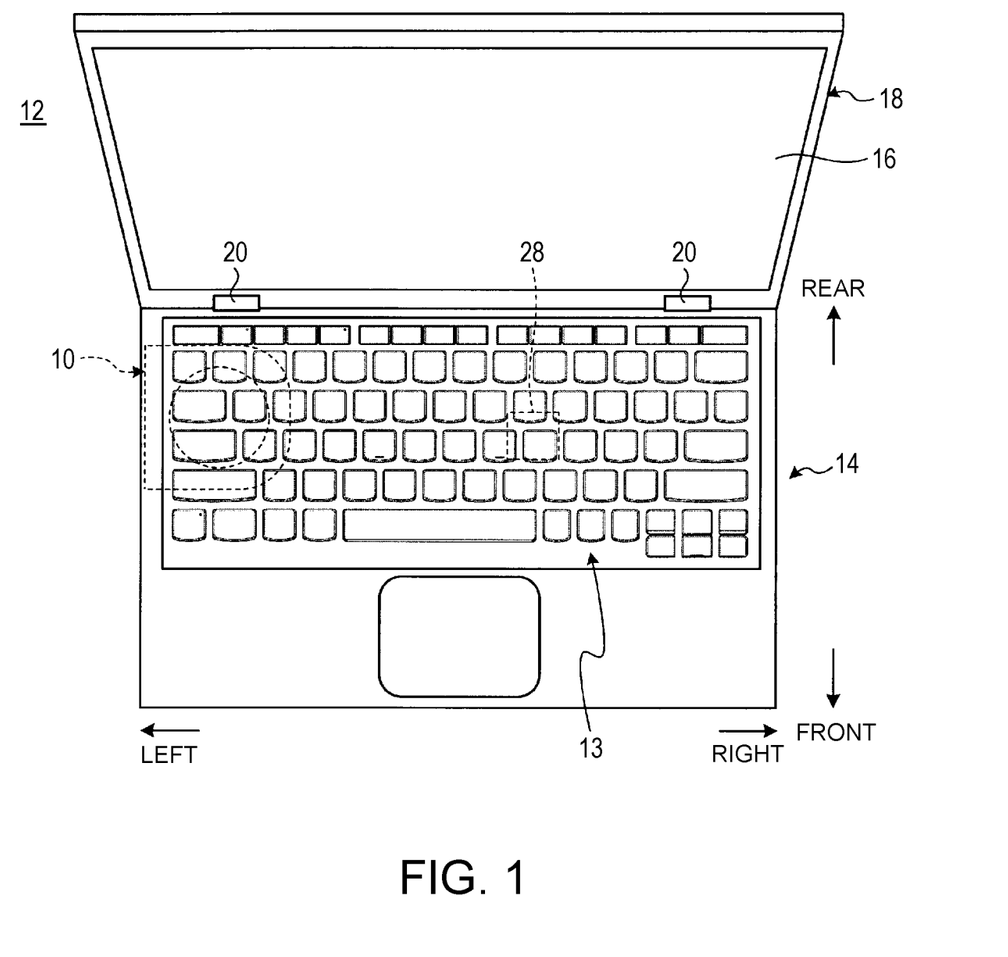
FIG. 1 is a plan view of an electronic device having a fan, according to a first embodiment.

FIG. 1 is a plan view of an electronic device 12 including a fan 10 according to a first embodiment. In this embodiment, the fan 10 is used in the electronic device 12 which is a laptop PC by way of example. However, the fan 10 can alternatively be used in various electronic devices, such as a tablet PC and a desktop PC, other than the laptop PC.

As illustrated in FIG. 1, the electronic device 12 includes a main body chassis 14 provided with a keyboard 13, and a display chassis 18 provided with a display 16. The display chassis 18 is pivotally coupled to a rear end portion of the main body chassis 14 via a pair of left and right hinges 20. The display chassis 18 is electrically connected to the main body chassis 14 via wiring (not illustrated) passing through the hinges 20. The display 16 is, for example, a liquid crystal display.

In FIG. 1, the electronic device 12 is viewed from above in the state where the display chassis 18 is opened relative to the main body chassis 14 via the hinges 20 so that the electronic device 12 is in a use state. Hereinafter, taking as a reference the direction of viewing from the front the display 16 of the electronic device 12 that is in the use state illustrated in FIG. 1, the main body chassis 14 will be described by referring to its near side as front, its far side as rear, its thickness direction as top-bottom, and its width direction as left-right.

Figure 2:
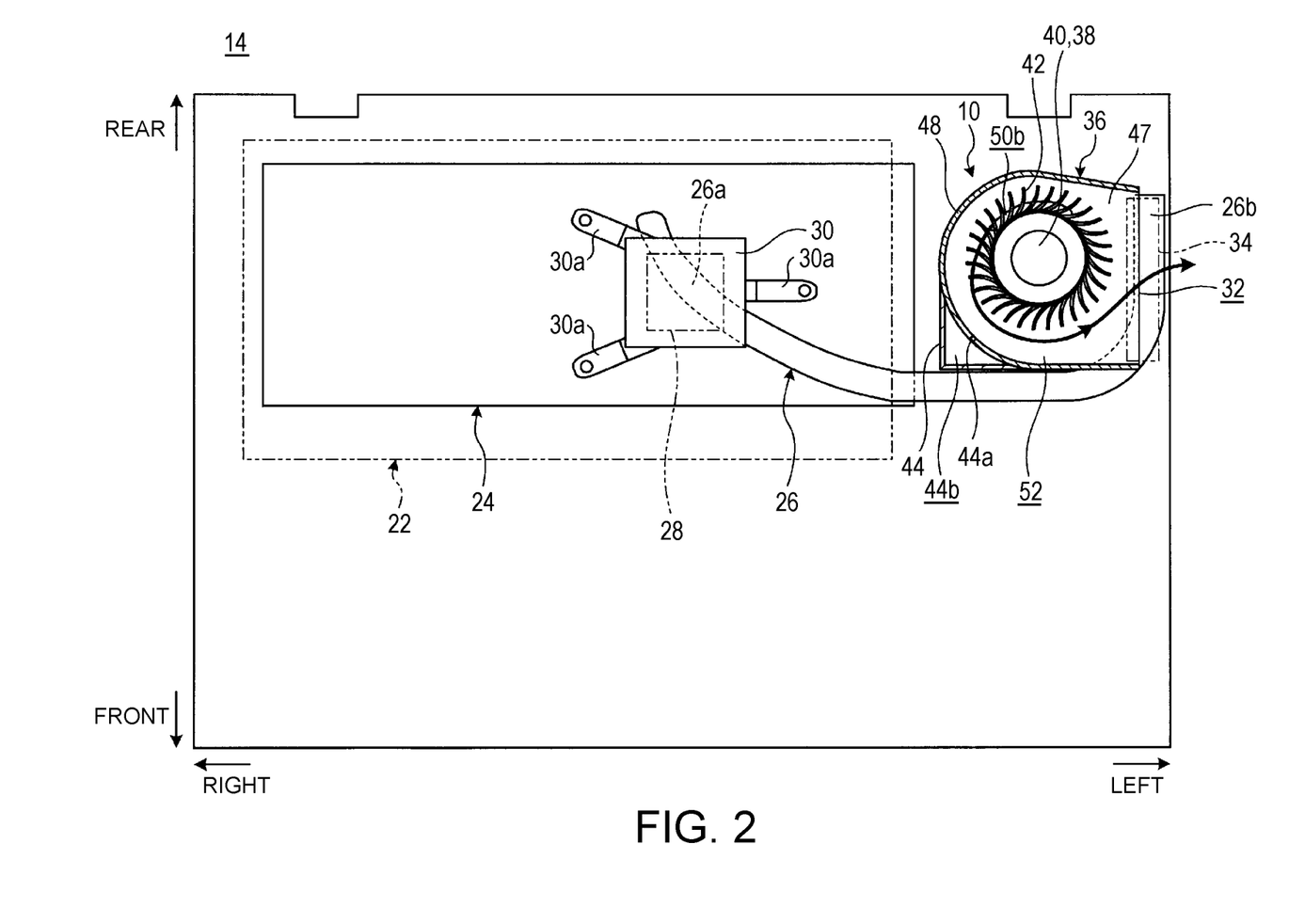
FIG. 2 is a bottom view of the electronic device from FIG. 1, illustrating the internal structure of a main body chassis.

FIG. 2 is a bottom view illustrating the internal structure of the main body chassis 14. In FIG. 2, the inside of the main body chassis 14 is viewed from below with a bottom plate of the main body chassis 14 removed, and only the fan 10 is illustrated in bottom section. As illustrated in FIG. 2, an electronic circuit board 22, a heat diffusion plate 24, a heat pipe 26, and the fan 10 are accommodated in the main body chassis 14.

The electronic circuit board 22 is a printed circuit board (PCB) mounted with various electronic components such as a CPU 28, a graphic chip (not illustrated), a memory (not illustrated), and a communication module (not illustrated). The CPU 28 is a central processing unit that performs calculations for main control and processing of the electronic device 12. Among the electronic components mounted in the main body chassis 14, the CPU 28 is the biggest heat generator.

The heat diffusion plate 24 is a plate-like member disposed to face a mounting surface, mounted with the CPU 28 and so on, of the electronic circuit board 22 and covering most of the mounting surface of the electronic circuit board 22. The heat diffusion plate 24 is made of, for example, a metal such as copper or aluminum having electrical conductivity and high thermal conductivity. The heat diffusion plate 24 is a heat spreader that absorbs heat generated by the electronic components such as the CPU 28 mounted on the electronic circuit board 22 and diffuses the heat in the in-plane direction.

The heat pipe 26 is, for example, configured such that a metal pipe with both ends jointed to form a closed space inside is crushed. The heat pipe 26 is a heat transfer device that can transfer heat with high efficiency by using the phase change of working fluid sealed in the closed space. One end portion 26a of the heat pipe 26 is connected to a top surface of the CPU 28 via a heat receiving plate 30 made of copper, aluminum, or the like so that heat can be transferred between the CPU 28 and the heat pipe 26. Specifically, the heat receiving plate 30, the heat pipe 26, and the heat diffusion plate 24 are stacked in this order on the top surface of the CPU 28. Another end portion 26b of the heat pipe 26 is joined to cooling fins 34 provided across an air outlet 32 of the fan 10. The heat receiving plate 30 is pressed against the CPU 28 by leaf springs 30a projecting in three directions.

Figure 3:
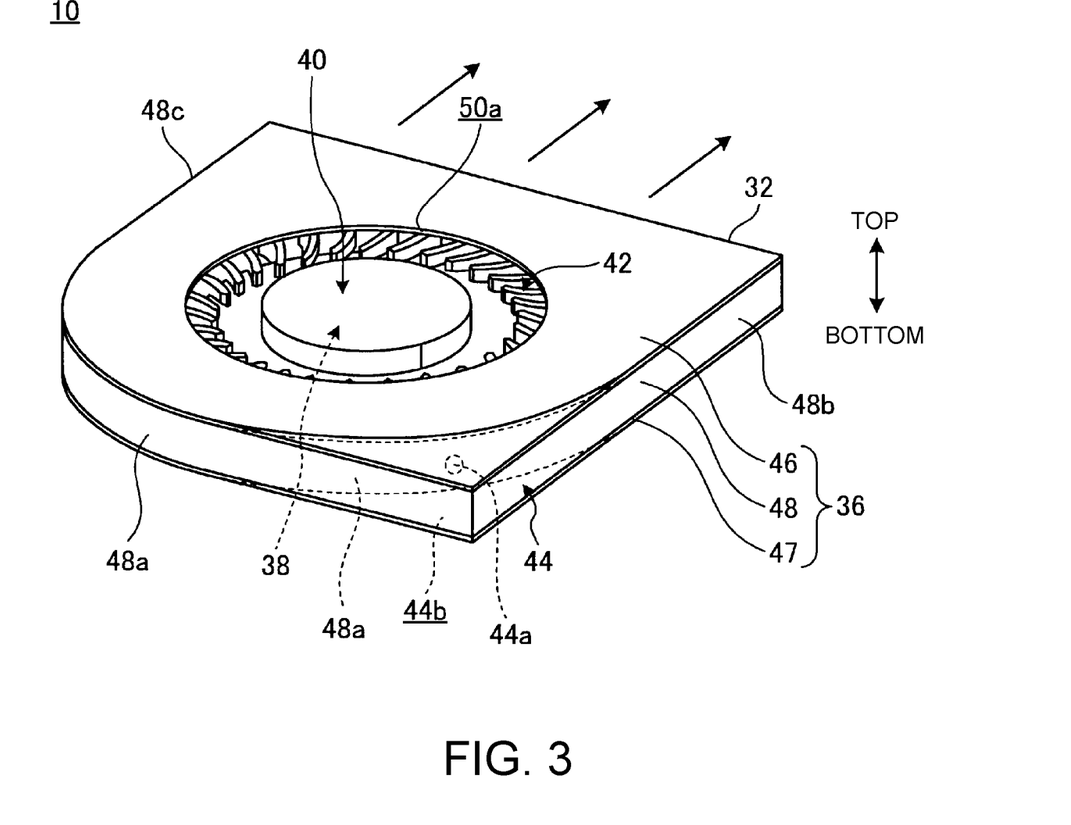
FIG. 3 is a perspective view of the fan.
Figure 4:
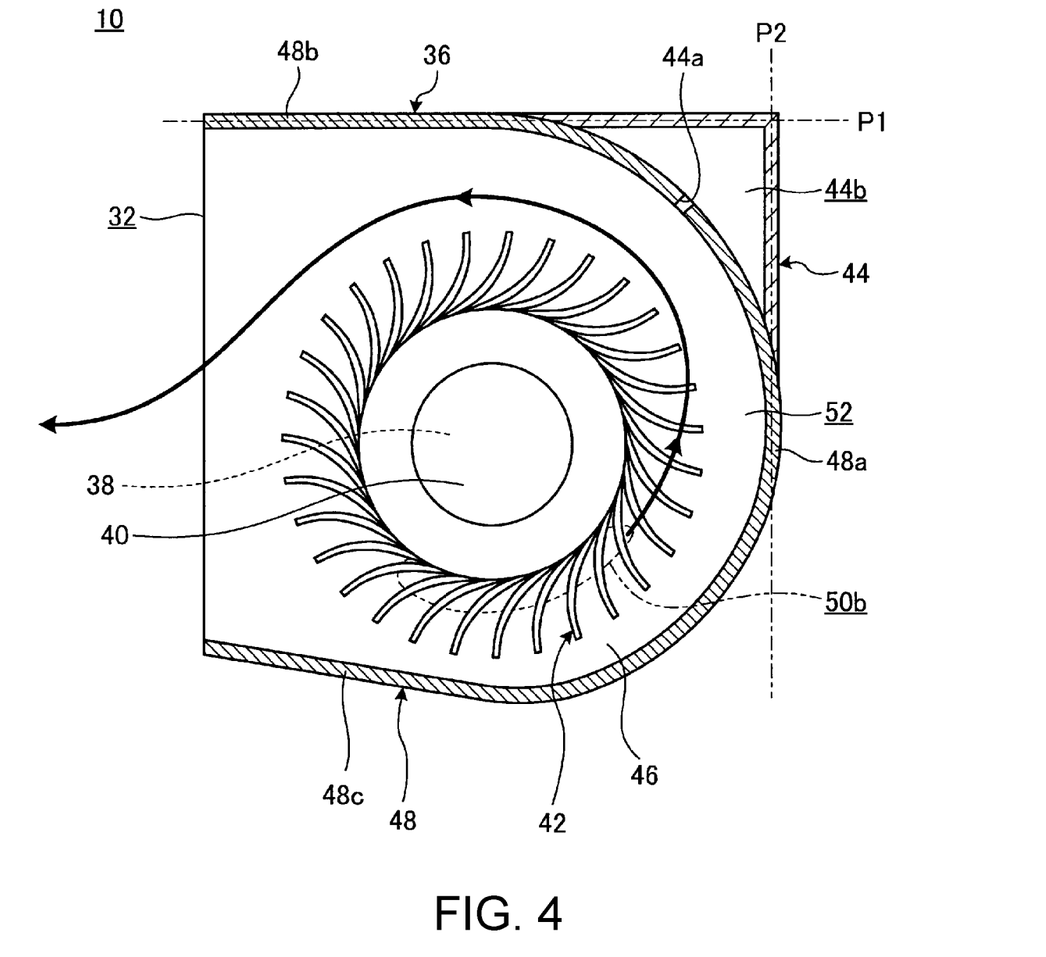
FIG. 4 is a plan view of the fan.

FIG. 3 is a perspective view of the fan 10. FIG. 4 is a plan sectional view of the fan 10.

As illustrated in FIGS. 2 to 4, the fan 10 includes a fan chassis 36, a motor part 38, a rotary shaft 40, an impeller part 42, and a resonator 44. The fan 10 is a centrifugal fan configured to rotate the impeller part 42 provided on an outer peripheral surface of the rotary shaft 40 by the motor part 38.

The fan chassis 36 includes a first cover plate 46 provided at one end in the axial direction of the rotary shaft 40, a second cover plate 47 provided at the other end in the axial direction of the rotary shaft 40, and a side wall plate 48 provided between the first cover plate 46 and the second cover plate 47.

The first cover plate 46 and the second cover plate 47 are each a thin plate having one side surface formed in an arc shape and the other three side surfaces each formed substantially in a straight line. The side wall plate 48 is a vertical wall plate extending along the contour of the first cover plate 46 and the second cover plate 47 and closes a space between the first cover plate 46 and the second cover plate 47 except the air outlet 32. The side wall plate 48 is composed of an arc-shaped plate part 48a formed in an arc shape to surround the outer periphery of the impeller part 42, and a pair of flat plate parts 48b, 48c extending substantially in the left-right direction from both ends of the arc-shaped plate part 48a.

The fan chassis 36 accommodates the motor part 38, the rotary shaft 40, and the impeller part 42. The fan chassis 36 is formed with the air outlet 32 and air inlets 50a, 50b at its outer surface and with an air passage 52 inside.

The air outlet 32 is formed between the open ends of the pair of flat plate parts 48b, 48c. The air outlet 32 may be provided at two or more places. The air inlet 50a is a circular opening formed at the center of the first cover plate 46 and exposes the rotary shaft 40 and a proximal portion of the impeller part 42. The air inlet 50b is an arc-shaped long hole and is formed in the vicinity of the center of the second cover plate 47 close to the rotary shaft 40. The air inlets 50a, 50b serve to introduce the outside air into the air passage 52 by the rotation of the impeller part 42. Only either one of the air inlets 50a, 50b may be provided. The air passage 52 is a duct for allowing the air introduced into the fan chassis 36 through the air inlets 50a, 50b by the rotation of the impeller part 42 to flow to the air outlet 32. The air passage 52 is formed in a portion surrounded by the first cover plate 46, the second cover plate 47, the side wall plate 48, and the rotary shaft 40. That is, the first cover plate 46, the second cover plate 47, and the side wall plate 48 (and the rotary shaft 40) serve as wall parts forming the air passage 52. The air passage 52 is a flow path formed in a one-turn spiral shape and capable of sending the air by the rotation of the impeller part 42.

The resonator 44 includes a cavity part 44b communicating with the air passage 52 through a communication passage 44a formed through the arc-shaped plate part 48a of the side wall plate 48. The communication passage 44a is opened to the air passage 52 at a position between the air inlets 50a, 50b and the air outlet 32. A wall part forming the cavity part 44b is, for example, formed integrally with the side wall plate 48 or formed separately from the side wall plate 48 and fixed thereto. The resonator 44 is a silencer that, based on the Helmholtz resonance principle, absorbs sound by friction of the air that occurs in the communication passage 44a, thereby reducing a predetermined frequency component. In this way, the resonator 44 reduces noise of the fan 10. The resonator 44 may be configured such that the volume of the cavity part 44b serving as a resonance chamber, the cross-sectional area and length of the communication passage 44a, and so on are set according to the frequency of noise to be reduced, such as the rotational speed of the motor part 38.

The resonator 44 is disposed on the outer surface side of the arc-shaped plate part 48a and has a shape that can be accommodated within the vertical thickness of the fan chassis 36, i.e., within the interval between the first cover plate 46 and the second cover plate 47. Consequently, the resonator 44 does not increase the thickness of the fan 10. In the case of this embodiment, the resonator 44 is formed in a portion surrounded by a first virtual plane P1 overlapping the flat plate part 48b forming one wall surface of the air passage 52, a second virtual plane P2 perpendicular to the first virtual plane P1 and forming a tangent to the arc-shaped plate part 48a in plan view illustrated in FIG. 4, and the arc-shaped plate part 48a. Consequently, the resonator 44 is disposed in a dead space created by the curved surface shape of the fan 10. As a result, even by providing the resonator 44, the fan 10 does not substantially increase in size and thus does not substantially take a space in the main body chassis 14.

Particularly, in the case of this embodiment, the resonator 44 is disposed at a position sandwiched between the heat pipe 26 passing through one side portion of the fan 10 and the fan chassis 36 (see FIG. 2). Therefore, the installation efficiency of the resonator 44 in the main body chassis 14 is further improved. It is to be noted that "the resonator 44 is disposed at a position sandwiched between the heat pipe 26 and the fan chassis 36" is a concept including a state where part of the resonator 44 is located at a position overlapping the heat pipe 26 and the fan chassis 36, a state where the heat pipe 26 and the fan chassis 36 overlap each other and the resonator 44 is disposed therebetween to overlap them, and so on.

The shape of the resonator 44 can be changed as appropriate. For example, a resonator 54 illustrated in FIG. 5 has a generally hemispherical dome shape and includes a cavity part 54b communicating with the air passage 52 through a communication passage 54a formed through the side wall plate 48. A resonator 56 illustrated in FIG. 6 has a generally conical flask shape and includes a cavity part 56b communicating with the air passage 52 through a communication passage 56a formed through the side wall plate 48.

Figure 5:
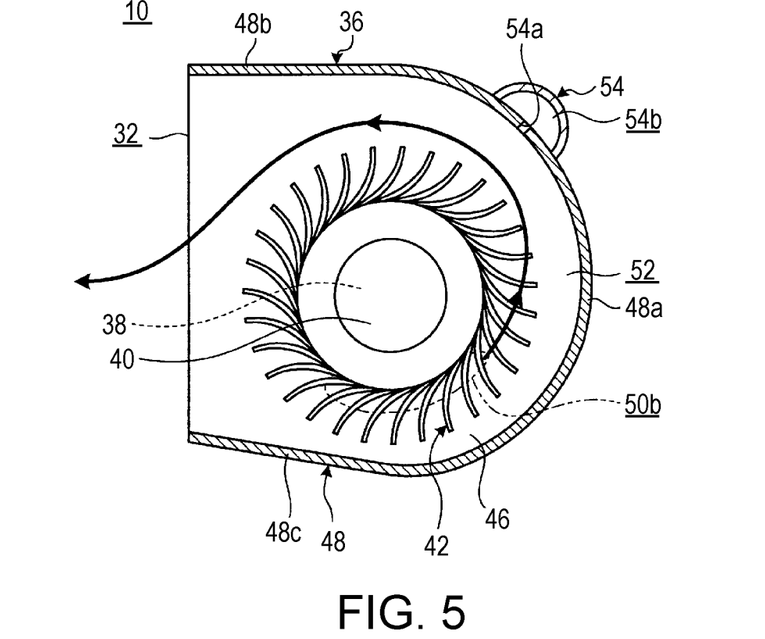
FIG. 5 is a plan view of the fan from FIG. 4 having a resonator, according to a first modification.
Figure 6:
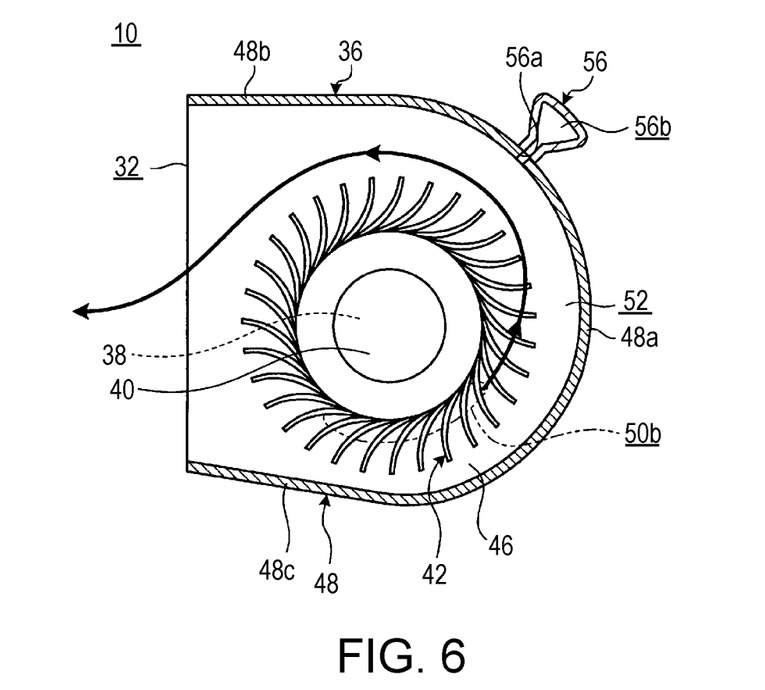
FIG. 6 is a plan view of the fan from FIG. 4 having a resonator, according to a second modification.

The installation position of the resonator 44, 54, 56 can be changed as appropriate. For example, the resonator 44 or the like may be provided on the outer surface side of the side wall plate 48 at a position other than the position illustrated in FIG. 4 or the like, or may be provided on the outer surface side of the first cover plate 46 or the second cover plate 47. However, since the positions illustrated in FIGS. 4 to 6 are each a position that not only enables effective use of a dead space, but also can produce resonance of the air pressurized to some extent by the rotation of the impeller part 42, a higher silencing effect can also be obtained. Further, the resonators 44 or the like may, for example, be connected to the air passage 52 at two portions on the upstream and downstream sides, respectively. Consequently, by causing frequencies to be silenced by the two resonators 44 or the like to differ from each other, it is also possible to silence noises of two specific frequencies, respectively.

As described above, the fan 10 according to this embodiment includes the air passage 52 that allows the air introduced through the air inlets 50*a*, 50*b* by the rotation of the impeller part 42 to flow to the air outlet 32, and the resonator 44 (54, 56) having the cavity part 44*b* (54*b*, 56*b*) communicating with the air passage 52 through the communication passage 44*a* (54*a*, 56*a*) passing through the wall part (the side wall plate 48) forming the air passage 52.

Therefore, the fan 10 can reduce its discrete tone noise by the resonator 44. Herein, the results of an experiment of measuring the noise and air flow rate of the fan 10 not provided with the resonator 44 and the fan 10 provided with the resonator 44 are shown below. As a result of the experiment, in the case of the configuration not provided with the resonator 44, the prominence ratio indicating the ratio of discrete tone noise (DTN) in the audible range was 4.2 (dB) and the air flow rate was 0.565 (CFM), while, in the case of the configuration of this embodiment provided with the resonator 44, the prominence ratio was 1.9 (dB) and the air flow rate was 0.589 (CFM). That is, while the change in air flow rate depending on the presence or absence of the resonator 44 was almost within the margin of error, the discrete tone noise when the resonator 44 was provided was less than half of the discrete tone noise when the resonator 44 was not provided. That is, it was also experimentally verified that the high silencing effect was obtained by providing the resonator 44.

The resonator 44 (54, 56) is directly connected to the air passage 52 formed in the fan chassis 36 through the communication passage 44*a* (54*a*, 56*a*). Therefore, as illustrated in FIG. 2, even in the case of the fan 10 for the electronic device 12 that is normally configured to be mounted such that no duct is disposed downstream of the air outlet 32, its noise can be effectively reduced. It is to be noted that the flow of the air does not occur between the cavity part 44*b* (54*b*, 56*b*) of the resonator 44 (54, 56) and the air passage 52. Therefore, even in the configuration where the communication passage 44*a* (54*a*, 56*a*) of the resonator 44 (54, 56) is directly connected to the air passage 52, the air flow rate of the fan 10 is not reduced as demonstrated by the results of the experiment described above.

In the fan 10, the communication passage 44*a* (54*a*, 56*a*) of the resonator 44 (54, 56) is formed through the side wall plate 48 of the fan chassis 36. That is, the resonator 44 (54, 56) is disposed on the outer surface side of the side wall plate 48. Therefore, an increase in the thickness of the fan chassis 36 due to the resonator 44 (54, 56) can be prevented so that the resonator 44 (54, 56) does not impede thinning of the fan 10.

In the case of this embodiment, the resonator 44 (54, 56) is provided on the outer surface side of the arc-shaped plate part 48*a* forming the side wall plate 48. Consequently, the resonator 44 (54, 56) can be disposed at a position that can produce resonance of the air pressurized to some extent by the rotation of the impeller part 42, so that a higher silencing effect can be obtained. Further, the outer surface side of the arc-shaped plate part 48*a* often becomes a dead space in an installed state of the fan 10 relative to the electronic device 12, and therefore, the resonator 44 (54, 56) can be provided by effectively using the dead space.

Figure 7:
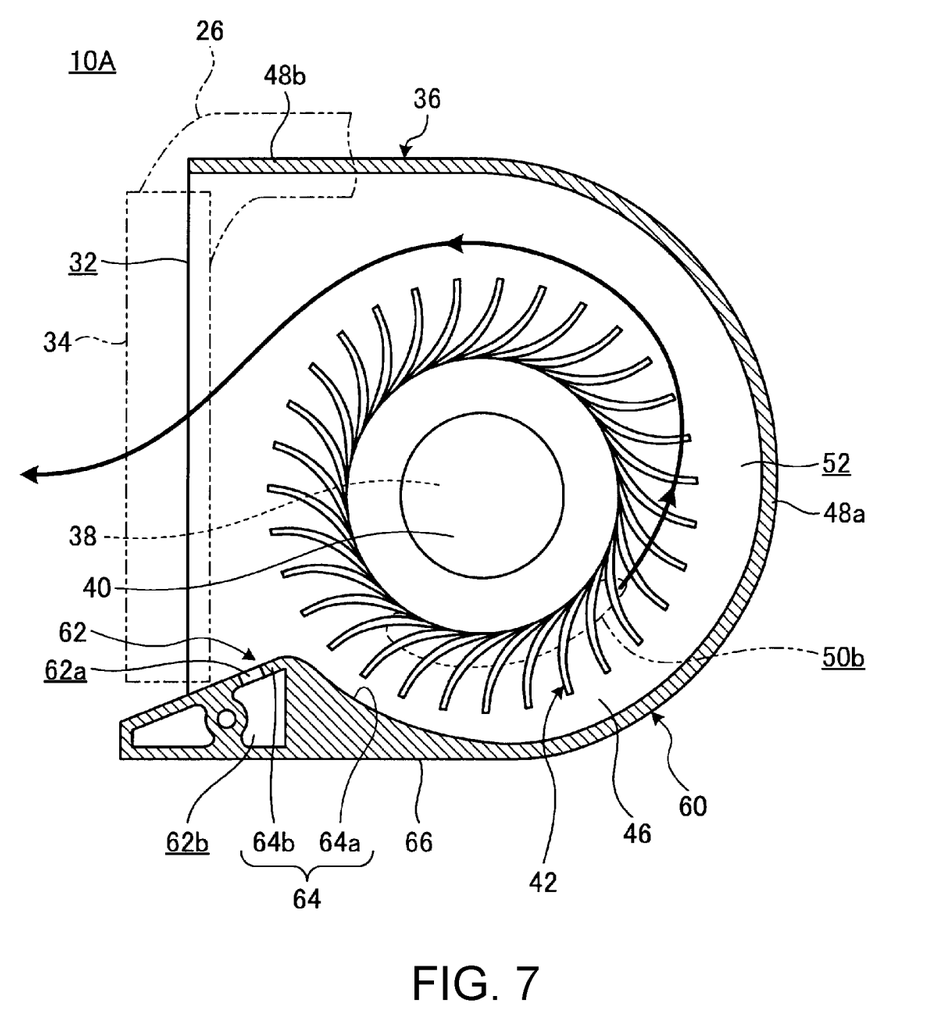
FIG. 7 is a plan view of a fan, according to a second embodiment.

FIG. 7 is a plan sectional view of a fan 10A according to a second embodiment. In the fan 10A according to the second embodiment, components that exhibit the same or similar functions and effects as those of the fan 10 according to the first embodiment will be assigned the same reference symbols, thereby omitting a detailed description thereof. The fan 10A includes a side wall plate 60 and a resonator 62 having configurations different from those of the fan 10.

The side wall plate 60 is composed of an arc-shaped plate part 48*a*, a flat plate part 48*b*, and an upstream-side wall part 64. The flat plate part (downstream-side wall part) 48*b* is provided on the downstream side (discharge side) of the arc-shaped plate part 48*a* in the flow direction of the air in an air passage 52. The upstream-side wall part 64 is provided on the upstream side of the arc-shaped plate part 48*a* in the flow direction of the air in the air passage 52. The upstream-side wall part 64 is provided to project into the air passage 52 from an outer wall plate 66 forming an outer wall of a fan chassis 36. The upstream-side wall part 64 narrows the flow path width of an upstream-side portion of the air passage 52 close to an air outlet 32. Like the flat plate part 48*c* of the fan 10, the outer wall plate 66 extends substantially in the left-right direction from an end of the arc-shaped plate part 48*a*.

The upstream-side wall part 64 is composed of a first wall part 64*a* and a second wall part 64*b*. The first wall part 64*a* is an arc-shaped wall part. The first wall part 64*a* is bent with a curvature approximately equal to that of the arc-shaped plate part 48*a* so as to extend along the contour of an impeller part 42. The second wall part 64*b* is provided to bend from an upstream-side end of the first wall part 64*a* toward the outer wall plate 66 side, i.e., in a direction away from the impeller part 42. The second wall part 64*b* forms one wall surface of the air outlet 32. The second wall part 64*b* is a portion that narrows the flow path width of a most-upstream portion of the air passage 52 to start pressurization of the air by the impeller part 42. The air outlet 32 is formed between the second wall part 64*b* and the flat plate part 48*b*.

The resonator 62 includes a cavity part 62*b* communicating with the air passage 52 through a communication passage 62*a* formed through the second wall part 64*b* of the upstream-side wall part 64. The communication passage 62*a* is provided to the second wall part 64*b* at a position between a bending point from the first wall part 64*a* to the second wall part 64*b* and the air outlet 32. The resonator 62 has a shape that can be accommodated within the vertical thickness of the fan chassis 36, i.e., within the interval between a first cover plate 46 and a second cover plate 47.

The resonator 62 is provided in a dead space formed between the upstream-side wall part 64 projecting from the outer wall plate 66 toward the air passage 52 side so as to narrow the air passage 52 at the most-upstream portion of the air passage 52, and the outer wall plate 66. As a result, even by providing the resonator 62, the fan 10A does not increase in size and thus does not take a space in a main body chassis 14.

Figure 8:
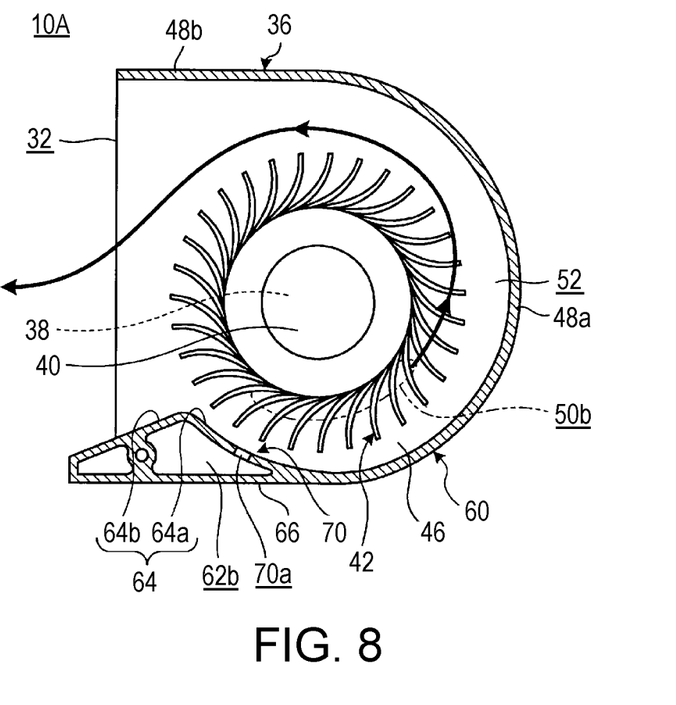
FIG. 8 is a plan view of the fan from FIG. 7 having a resonator, according to a first modification.
Figure 9:
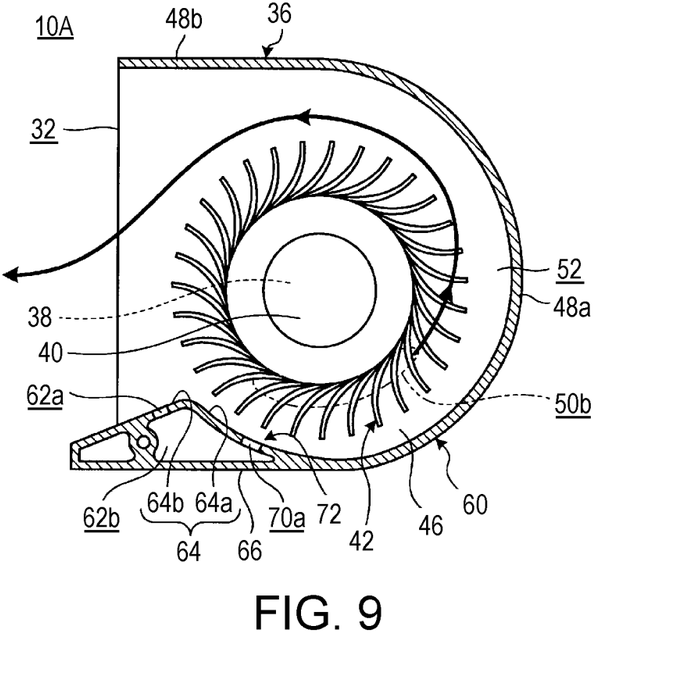
FIG. 9 is a plan view of the fan from FIG. 7 having a resonator, according to a second modification.

The configuration of the resonator 62 can be changed as appropriate. For example, a resonator 70 illustrated in FIG. 8 is configured such that a communication passage 70*a* is formed through a first wall part 64*a* of an upstream-side wall part 64. A cavity part 62*b* illustrated in FIG. 8 is greater in volume than the cavity part 62*b* illustrated in FIG. 7, by way of example. As described above, the volume of the cavity part 62*b* may be set as appropriate according to the frequency of noise to be reduced, and accordingly, the cavity part 62*b* illustrated in FIG. 8 may have the same volume as the cavity part 62*b* illustrated in FIG. 7. Further, for example, a resonator 72 illustrated in FIG. 9 is configured such that a communication passage 62*a* is formed through a second wall part 64*b* of an upstream-side wall part 64, that a communication passage 70*a* is formed through a first wall part 64*a* of the upstream-side wall part 64, and that the communication passages 62*a*, 70*a* communicate with a common cavity part 62*b*. That is, the resonator 72 is configured such that the cavity part 62*b* communicates with the air passage 52 through the pair of communication passages 62*a*, 70*a*.

With the resonator 44 of the fan 10 according to the first embodiment, the flow of the air does not normally occur between the cavity part 44*b* and the air passage 52. However, in the case of the fan 10, there is a concern that, depending on the rotational speed of the motor part 38, the structure of the impeller part 42 or the air passage 52, or the like, the communication passage 44*a* may serve as an obstacle to the air flowing in the air passage 52 to cause an increase in pressure loss or a reduction in air flow rate.

On the other hand, in the fan 10A according to this embodiment, the communication passage 62*a* (70*a*) of the resonator 62 (70, 72) is provided to the upstream-side wall part 64 provided on the upstream side in the flow direction of the air in the air passage 52. Therefore, the fan 10A can suppress that the air sent out by the impeller part 42 directly hits the communication passage 62*a* (70*a*). Accordingly, the fan 10A can suppress a situation that the communication passage 62*a* (70*a*) serves as an obstacle to the flowing air to change the air flow rate or to generate noise due to the collision of the air against the communication passage 62*a* (70*a*). As a result, with the fan 10A, the silencing effect by the resonator 62 (70, 72) can be further improved, and the change in air flow rate can also be further suppressed. Like in the case of the fan 10, the fan 10A including the upstream-side wall part 64 may also be configured such that the communication passage 62*a* (70*a*) is formed through the arc-shaped plate part 48*a*.

In the fan 10A, since the cooling fins 34 are disposed in the air outlet 32, the air outlet 32 should have a somewhat large opening width. That is, the interval between the flat plate part 48*b* and the second wall part 64*b* should be somewhat large. On the other hand, since the most-upstream portion of the air passage 52 close to the air outlet 32 is a portion where pressurization of the air by the impeller part 42 is started, the width of the air passage 52 is narrowed by the upstream-side wall part 64. Therefore, a certain dead space is formed between the upstream-side wall part 64 and the outer wall plate 66. Thus, by providing the resonator 62 (70, 72) in this dead space, the fan 10A prevents an increase in the size of the fan chassis 36 due to the resonator 62 (70, 72).

Particularly, in the resonator 62 illustrated in FIG. 7, the communication passage 62*a* is provided not to the first wall part 64*a* directly facing the air passage 52, but to the second wall part 64*b* located at a position retreated outward from the air passage 52. Therefore, it is further suppressed that the air sent out by the impeller part 42 blows into the communication passage 62*a* and that the communication passage 62*a* serves as an obstacle to the air. As a result, since the change in the silencing effect of the resonator 62 due to the change in air flow rate is further reduced, a more stable high silencing effect is obtained.

As has been described, the present invention provides an improved fan having reduced DTN.

While the invention has been particularly shown and described with reference to a preferred embodiment, it will be understood by those skilled in the art that various changes in form and detail may be made therein without departing from the spirit and scope of the invention.

What is claimed is:

1. A fan, comprising:
   a rotatory shaft;
   a fan chassis having
      an air inlet located on a first side of said fan chassis, wherein said air inlet is concentric with said rotatory shaft;
      an air outlet formed on a second side of said fan chassis, wherein said second side is orthogonal to said first side;
      a wall part forming an air passage that connects said air inlet to said air outlet, wherein said wall part includes a curved section surrounding a portion of said rotatory shaft;
      a communication passage located on said curved section of said wall part;
      a resonator connected to said curved section of said wall part, wherein said resonator includes a cavity part that communicates with said air passage of said wall part via said communication passage passing through said curved section of said wall part, wherein said resonator also includes a first virtual plane overlapping a straight section of said wall part, and a second virtual plane perpendicular to said first virtual plane and forming a tangent to said curved section of said wall part; and
   an impeller part for bringing outside air into said air inlet, by a rotation of said impeller part, to flow to said air outlet via said air passage.

2. The fan of claim 1, wherein said impeller part is concentric with said rotatory shaft.

3. The fan of claim 1, wherein said air inlet is circular in shape and said air outlet is rectangular in shape.

4. An electronic device, comprising:
   a display chassis containing a display; and
   a main body chassis rotatably connected to said display chassis via a hinge, wherein said main body chassis contains a fan that includes
      a rotatory shaft;
      a fan chassis having
         an air inlet located on a first side of said fan chassis, wherein said air inlet is concentric with said rotatory shaft;
         an air outlet formed on a second side of said fan chassis, wherein said second side is orthogonal to said first side;
         a wall part forming an air passage that connects said air inlet to said air outlet, wherein said wall part includes a curved section surrounding a portion of said rotatory shaft;
         a communication passage located on said curved section of said wall part;
         a resonator connected to said curved section of said wall part, wherein said resonator includes a cavity part that communicates with said air passage of said wall part via said communication passage passing through said curved section of said wall part, wherein said resonator also includes a first virtual plane overlapping a straight section of said wall part, and a second virtual plane perpendicular to said first virtual plane and forming a tangent to said curved section of said wall part; and an impeller part, for bringing outside air into said air inlet, by a rotation of said impeller part, to flow to said air outlet via said air passage.

5. The electronic device of claim 4, wherein said impeller part is concentric with said rotatory shaft.

6. The electronic device of claim 4, wherein said air inlet is circular in shape and said air outlet is rectangular in shape.

* * * * *